United States Patent [19]

Sukegawa

[11] Patent Number: 4,778,773
[45] Date of Patent: Oct. 18, 1988

[54] METHOD OF MANUFACTURING A THIN FILM TRANSISTOR

[75] Inventor: Osamu Sukegawa, Tokyo, Japan

[73] Assignee: NEC Corporation, Japan

[21] Appl. No.: 60,732

[22] Filed: Jun. 10, 1987

[30] Foreign Application Priority Data

Jun. 10, 1986 [JP] Japan .................. 61-135296

[51] Int. Cl.$^4$ ............... H01L 21/265; H01L 21/44
[52] U.S. Cl. .................... 437/41; 357/23.7; 437/187; 437/43
[58] Field of Search ............ 357/23.7, 23.9; 437/41, 437/40, 101, 173, 187, 43; 350/336

[56] References Cited

U.S. PATENT DOCUMENTS 4,700,458 10/1987 Suzuki .......................... 437/41

FOREIGN PATENT DOCUMENTS 0090661 10/1983 European Pat. Off. .
113666A 6/1984 Japan .................... 357/23.7
189676A 10/1984 Japan .

OTHER PUBLICATIONS

Ghandhi, VLS1 Fabrication Principles, John Wiley and Sons, Inc., 1983, pp. 542–550 and 582–585.
Kodama et al., "A self-Alignment Process for Amorphous Silicon Thin Film Transistors", IEEE Electron Device Letters, vol. EDL-3, No. 7, Jul. 1982, pp. 187–189.
Kawai et al., "A Self-Alignment Processed a-Si:H TFT Matrix Circuit for LCD Panels", Proceedings of the SID, vol. 25/1, 1984, pp. 21–24.

Primary Examiner—Brian E. Hearn
Assistant Examiner—M. Wilczewski
Attorney, Agent, or Firm—Laff, Whitesel, Conte & Saret

[57] ABSTRACT

A method of manufacturing a thin film transistor comprises the steps of forming a gate electrode on one surface of a transparent substrate, forming on the substrate an insulating layer and a semiconductor layer in the named order to cover the gate electrode, and depositing a positive photoresist layer on the semiconductor layer. Thereafter, the photoresist layer is exposed by irradiating from the other surface of the substrate so as to use the gate electrode as a mask. Therefore, if the positive photoresist layer is developed, the unexposed portion remains on the semiconductor layer to correspond to the gate electrode. Then, the semiconductor layer is etched using the remaining photoresist as a mask so as to form a semiconductor island on the insulating layer, and source and drain electrodes are formed on the semiconductor island.

8 Claims, 4 Drawing Sheets

METHOD OF MANUFACTURING A THIN FILM TRANSISTOR

BACKGROUND OF THE INVENTION

1. Field of the Invention

The present invention relates to thin film transistors which can be used as driving elements for panel displays such as liquid crystal displays. More specifically, the present invention relates to a method of manufacturing a thin film transistor, which can realize formation of socalled islands and planar structure in a self-aligned manner.

2. Description of Related Art

Recently, thin film transistors have been widely incorporated as driving elements in liquid crystal display panels. The thin film transistors are generally formed of amorphous silicon, and mainly divided into two types, the coplanar type and the stagger type. The stagger type is also divided into a normal stagger type and an inverted stagger type.

Heretofore, the inverted stagger type thin film transistors have been manufactured in the following manner: a gate electrode metal is deposited on a substrate and then etched to a given pattern of gate electrodes. A gate insulator layer is formed on the substrate to cover the gate electrodes, and an i-type amorphous silicon layer providing an active layer and an n+-type amorphous silicon layer for ohmic contact are formed on the gate insulator layer in the named order. Thereafter, the amorphous silicon layers are selectively removed excepting portions to be left for constituting transistors. Namely, semiconductor islands are formed.

In the prior art, an independent mask is prepared for formation of islands, and the islands are formed by photolithography. In addition, drain and source electrode wirings are provided to lie on step portions formed by the islands.

However, the conventional island forming method is disadvantageous in that the large area patterning of the liquid crystal display is greatly influenced by precision of the mask used, a slight defect of the mask used, and precision of mask alignment. Further, since the drain and source electrode wirings lie on the steps formed by the gate electrodes and the islands, the electrode wirings are often broken at the step coverage portion and because of a so-called side etching when the electrode metal is etched to provide a given pattern of electrodes and wirings.

SUMMARY OF THE INVENTION

Accordingly, it is an object of the present invention to provide a method of manufacturing a thin film transistor, which can form so-called islands at a very high positional and dimensional precision.

Another object of the present invention is to provide a method of manufacturing a thin film transistor which can form the islands in a self-alignment manner without using an independent mask.

Still another object of the present invention is to provide a method of manufacturing a thin film transistor, which can realize a planar structure so that a drain and source electrode wiring can be formed without a fear of break due to step coverage and side etching.

The above and other objects of the present invention are achieved in accordance with one aspect of the present invention by a method of manufacturing a thin film transistor comprising the steps of forming a gate electrode on one surface of a transparent substrate, forming on the substrate an insulating layer and a semiconductor layer in the named order to cover the gate electrode, depositing a photoresist layer on the semiconductor layer, exposing a photoresist layer by irradiating from the other surface of the substrate so as to use the gate electrode as a mask, developing the photoresist layer so that the unexposed portion remains on the semiconductor layer to correspond to the gate electrode, etching the semiconductor layer using the remaining photoresist as a mask so as to form a semiconductor island on the insulating layer, and forming source and drain electrodes on the semiconductor island.

Specifically, a positive photoresist is deposited on the semiconductor layer to form the photoresist layer.

Furthermore, the above method can include the steps of, after the formation of the semiconductor island, depositing a second insulating layer on the substrate to cover the semiconductor island and the first named insulating layer, depositing a second photoresist layer on the second insulating layer, exposing the second photoresist layer by irradiating from the other surface of the substrate so as to use the gate electrode as a mask, developing the second photoresist layer so that the second photoresist layer has an opening corresponding to the unexposed portion, etching the second insulating layer in the opening so that the semiconductor island is exposed, and removing the second photoresist layer so that there is exposed a substantially flat surface formed by the semiconductor island and the remaining second insulating layer surrounding the semiconductor island. Specifically, a negative photoresist is deposited on the second insulating layer to form the second photoresist layer.

Alternatively, the above method can further include the steps of, after the formation of the semiconductor layer, forming on the semiconductor layer a second insulating layer at a thickness greatly larger than that of the semiconductor layer, depositing the above mentioned photoresist layer on the second insulating layer, exposing the photoresist layer by irradiating from the other surface of the substrate so as to use the gate electrode as the mask, developing the photoresist layer so that the unexposed portion remains on the second insulating layer to correspond to the gate electrode, etching the second insulating layer and the semiconductor layer using the remaining photoresist layer as the mask so as to form on the first named insulating layer the semiconductor island having the second insulating layer remaining on the top surface thereof, depositing on the substrate a third insulating layer at a thickness larger than the semiconductor layer but sufficiently smaller than the second insulating layer so that the semiconductor island, the remaining second insulator and the first named insulating layer are covered by the third insulating layer, the third insulating layer being formed of a material which can be etched at an etch rate sufficiently lower than that of the second insulating layer, and etching the second and third insulating layer with an etchant which etches the second insulating layer at a rate higher than that of the third insulating layer, whereby there is exposed a substantially flat surface formed by the semiconductor island and the remaining third insulating layer surrounding the semiconductor island.

According to another aspect of the present invention, there is provided a method of manufacturing an inverted stagger type of thin film transistor comprising the steps of forming a gate electrode on one surface of a transparent substrate, forming on the substrate a first insulating layer and a semiconductor layer in the named order to cover the gate electrode, depositing a positive photoresist layer on the semiconductor layer, exposing the positive photoresist layer by irradiating from the other surface of the substrate so as to use the gate electrode as a mask, developing the positive photoresist layer so that the unexposed portion remains on the semiconductor layer to correspond to the gate electrode, etching the semiconductor layer using the remaining photoresist as a mask so as to form a semiconductor island on the first insulating layer, depositing a second insulating layer on the substrate to cover the semiconductor island and the first insulating layer, depositing a negative photoresist layer on the second insulating layer, exposing the negative photoresist layer by irradiating from the other surface of the substrate so as to use the gate electrode as a mask, developing the negative photoresist layer so that the negative photoresist layer has an opening corresponding to the unexposed portion, etching the second insulating layer in the opening so that the semiconductor island is exposed, removing the second photoresist layer so that there is exposed a substantially flat surface formed by the semiconductor island and the remaining second insulating layer surrounding the semiconductor island, and forming source and drain electrodes on the semiconductor island.

Further, according to a third aspect of the present invention, there is provided a method of manufacturing an inverted stagger type of thin film transistor comprising the steps of forming a gate electrode on one surface of a transparent substrate, forming on the substrate a first insulating layer and a semiconductor layer in the named order to cover the gate electrode, forming on the semiconductor layer a second insulating layer at a thickness greatly larger than that of the semiconductor layer, depositing a positive photoresist layer on the second insulating layer, exposing the photoresist layer by irradiating from the other surface of the substrate so as to use the gate electrode as the mask, developing the photoresist layer so that the unexposed portion remains on the second insulating layer to correspond to the gate electrode, etching the second insulating layer and the semiconductor layer using the remaining photoresist layer as the mask so as to form on the first insulating layer the semiconductor island having the second insulating layer remaining on the top surface thereof, depositing on the substrate a third insulating layer at a thickness larger than the semiconductor layer but sufficiently smaller than the second insulating layer so that the semiconductor island, the remaining second insulator and the first insulating layer are covered by the third insulating layer, the third insulating layer being formed of a material which can be etched at an etch rate sufficiently lower than that of the second insulating layer, and etching the second and third insulating layer with an etchant which etches the second insulating layer at a rate higher than that of the third insulating layer, so that there is exposed a substantially flat surface formed by the semiconductor island the remaining third insulating layer surrounding the semiconductor island, and forming source and drain electrodes on the semiconductor island.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
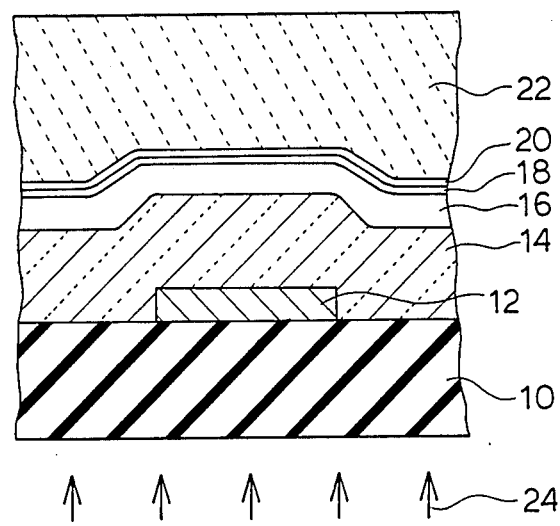
FIGS. 1A to 1G are partial sectional views illustrating a process of one embodiment of the thin film transistor manufacturing method in accordance with the present invention.
Figure 1B:
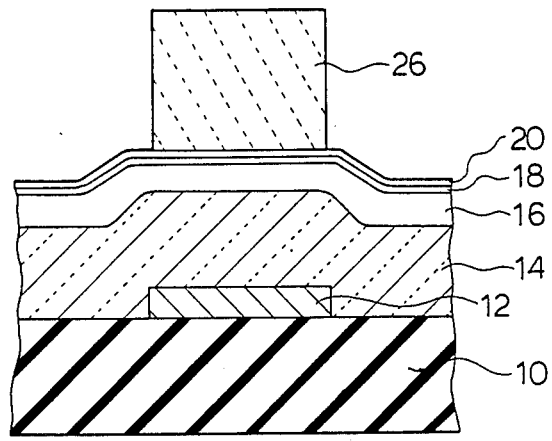

Referring to FIGS. 1A to 1B, there is illustrated one embodiment of the method of manufacturing a thin film transistor.

FIG. 1A shows a glass substrate 10 having a chromium gate electrode 12 of a predetermined pattern, a gate insulator layer 14, an i-type amorphous silicon layer 16, an n+-type amorphous silicon layer 18, an anti-oxidation protection coating 20 and a positive photoresist layer 22 which are formed on a top surface of the substrate 10 in the named order. This layered structure can be easily formed in conventional manner. For example, the gate electrode 12 can be formed by evaporating a thin film of chromium on the top surface of the substrate 10 and etching the chromium film to a predetermined gate electrode pattern. The gate insulator layer 14 can be formed of $Si_3N_4$ at a thickness of 300 nm. Further, the i-type and the n+-type amorphous silicon layers 16 and 18 are formed at thickness of 100 nm and 20 nm, respectively. These layers 14, 16 and 18 can be formed by a plasma CVD method. The protection coating 20 is formed of an ITO (indium tin oxide) layer of 20 nm thickness, and can be deposited by a spattering.

In this condition, the positive photoresist layer 22 is exposed by irradiating an exposure radiation 24 from the rear surface of the substrate 10, as shown in FIG. 1A. In the exposure process, the gate electrode 12 blocks the incident radiation. Namely, the gate electrode 12 functions as an exposure mask. Thereafter, the photoresist layer 22 is developed, and an unexposed photoresist pattern 26 remains just above the gate electrode 12, as shown in FIG. 1B.

Next, by using the resist pattern 26 as an etching mask, the ITO protection coating 20 is patterned by a wet etching, and the two amorphous silicon layers 16 and 18 are also patterned by a dry etching. Further, the remaining photoresist pattern 26 is removed.

Figure 1C:
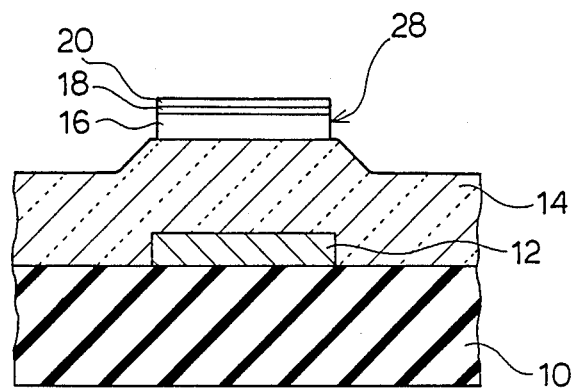

As a result, a semiconductor island 28, which is composed of the i-type and n+-type amorphous silicon layers 16 and 18 and the ITO protection coating 20, is formed on the $Si_3N_4$ layer 14, as shown in FIG. 1C. This island 28 is perfectly in alignment to the gate electrode 12.

Figure 1D:
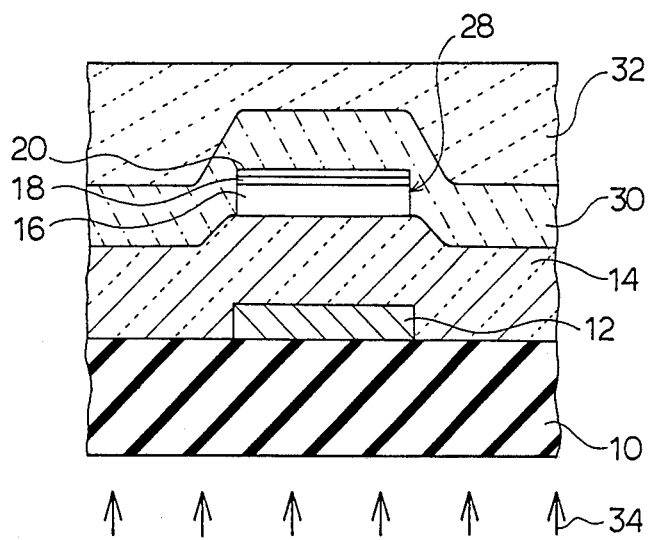

Thereafter, a second insulating layer 30 for planarization is formed on the substrate 10 to cover the semiconductor island 28. This insulating layer 30 is thicker than the semiconductor island 28, and is formed by a $Si_3N_4$ layer having a thickness of 200 nm, which can deposited by for example plasma CVD. Further, a negative photoresist layer 32 is coated on the $Si_3N_4$ layer 30, as shown in FIG. 1D.

Figure 1E:
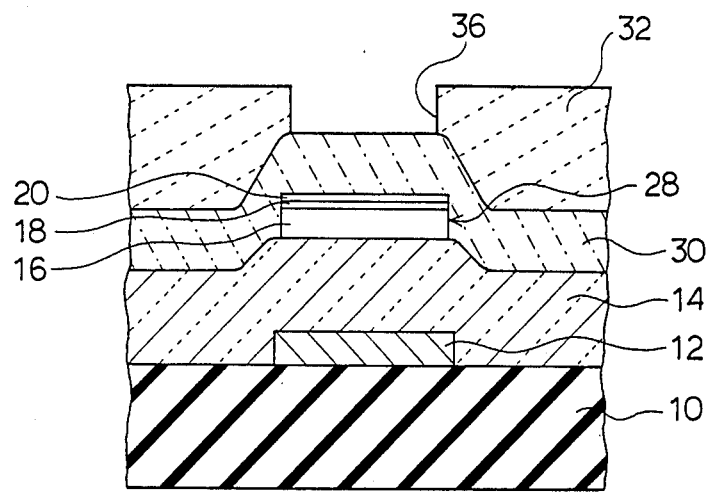

In this condition, radiation 34 is irradiated from the rear side of the substrate 10 to expose the negative photoresist layer 32. At this time, the gate electrode 12 functions as an exposure mask, again. Therefore, by developing the negative photoresist layer 32, an unexposed portion is removed, so that an opening 36 corresponding to the gate electrode 12 is formed in the photoresist layer 32, as shown in FIG. 1E.

Figure 1F:
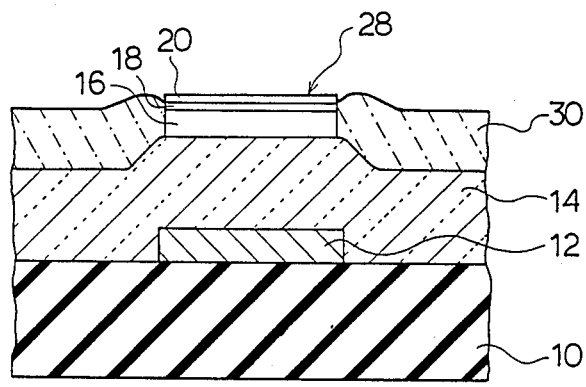

Thereafter, the planarization insulating layer 30 on the island 28 is etched through the opening 36. For example, a buffered HF-H$_2$O which does not erode the ITO layer 20 is used as etchant to isotopically etch the Si$_3$N$_4$ layer 30. Then, if the negative photoresist layer 32 is removed, there appears a substantially flat top surface formed by the semiconductor island 28 and the Si$_3$N$_4$ layer 30 surrounding the island 28, as shown in FIG. 1F.

Figure 1G:
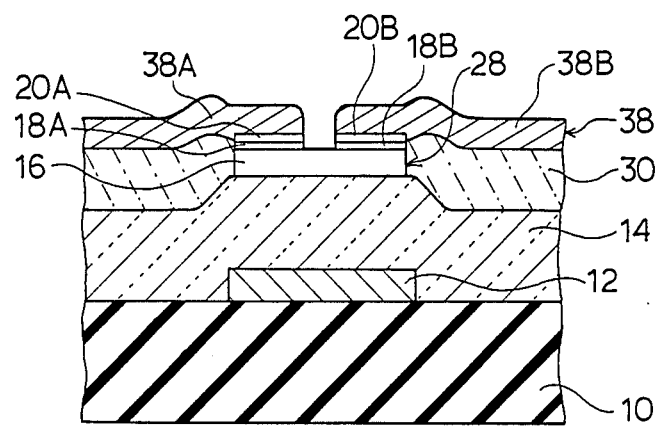

Then, a conductor is deposited on the upper surface of the semiconductor island 28 and the Si$_3$N$_4$ layer 30. For example, an ITO layer 38 of 50 nm thickness is deposited by sputtering, and then a patterning is made to provide drain and source electrodes and wirings, as shown in FIG. 1G. Namely, the n$^+$-type amorphous layer 18, the ITO layer 20 and the ITO layer 38 are divided into two, respectively. Specifically, the n$^+$-type amorphous layer 18 is separated to a drain contact region 18A and a source contact region 18B. The ITO layer 20 is divided into a drain electrode 20A and a source electrode 20B. The ITO layer 38 is patterned to provide a drain electrode wiring 38A and a source electrode wiring 38B.

Figure 2:
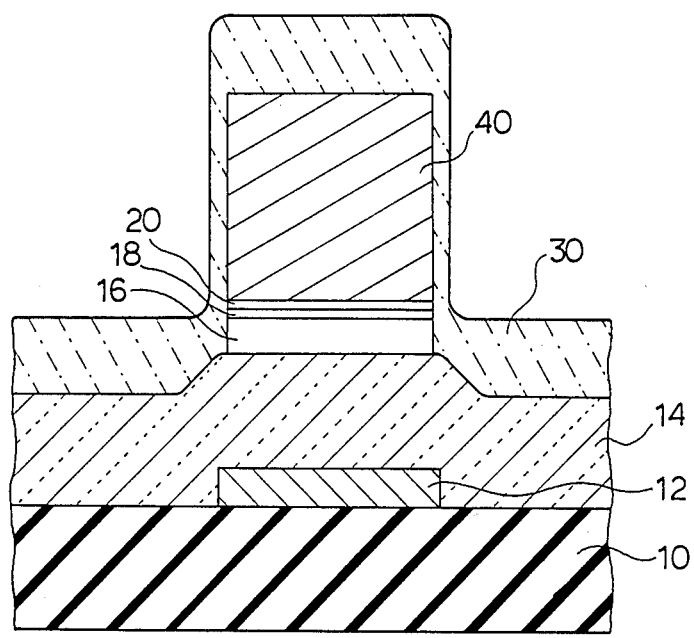
FIG. 2 is a partial sectional view showing one step of another embodiment of the thin film transistor manufacturing method in accordance with the present invention.

Turning to FIG. 2, there is shown one step of a process in accordance with another embodiment of the present invention. The shown step corresponds to that shown in FIG. 1E. In this figure, portions similar to those shown in FIGS. 1A to 1G are given the same Reference Numerals.

In this embodiment, the planarization insulating layer 30 is formed of a sputtered SiO$_2$ layer, and there is deposited on the ITO layer 20 a SiN$_x$ layer 40 of a high hydrogen content which is formed to have a thickness of about 600 nm by means of plasma CVD method.

The structure shown in FIG. 2 can be realized by the step of, after formation of the ITO layer 20, forming on the ITO layer 20 the SiN$_x$ layer 40 at the thickness of 600 nm, depositing the positive photoresist layer 22 on the SiN$_x$ layer 40, exposing the photoresist layer 22 by irradiating from the rear surface of the substrate 10, etching the SiN$_x$ layer 40 and the underlying layers 16, 18 and 20 using the remaining photoresist layer 22 as the mask, and depositing the SiO$_2$ layer 30 on the gate insulator layer 14 and the island.

Thereafter, the buffered HF-H$_2$O is applied to the structure shown in FIG. 2. The etch rate of the buffered HF-H$_2$O to the SiN$_x$ is greatly larger than that of SiO$_2$. Further, the SiO$_2$ thickness of the side wall of the island is considerably smaller than that of the SiO$_2$ layer 30 on the horizontal portion because the island has a step difference of about 800 nm which is greatly larger than the thickness (200 nm) of the SiO$_2$ horizontal portion. Because of these two reasons, the SiN$_x$ layer 40 in the island is quickly removed as compared to the horizontal portion of the SiO$_2$ layer 30. Thus, the planarization can be realized by utilizing the thickness difference between the vertical and horizontal portions of the SiO$_2$ layer and the etch rate difference between SiN$_x$ and SiO$_2$, without the patterning process for planarization as shown in FIGS. 1D and 1E.

As seen from the above, the island can be formed in a self-alignment manner and without using an independent mask, by means of a rear surface exposure using a gate electrode as an exposure mask.

Further, a planarization can be realized without using an independent mask, by depositing a planarization insulator layer and a photoresist layer to cover the island, exposing the photoresist layer from the rear surface of the substrate, and selectively etching the planarization insulator layer through the patterned photoresist layer so that the insulator layer remains excepting the top surface of the island.

Thus, a mask exposure process can be omitted, and a drain and source wiring can be realized with a small step. Therefore, the possibility of break of wiring due to the step difference can be greatly decreased.

The invention has thus been shown and described with reference to the specific embodiments. However, it should be noted that the invention is in no way limited to the details of the illustrated structures but changes and modifications may be made within the scope of the appended claims.

I claim:

1. A method of manufacturing a thin film field-effect transistor comprising the steps of forming a gate electrode on a top surface of a transparent substrate, forming an insulating layer to cover the gate electrode and the exposed top surface of the substrate, forming a semiconductor layer to cover the insulating layer, depositing a positive photoresist layer on the semiconductor layer, exposing the photoresist layer by irradiating from the bottom surface of the substrate so as to use the gate electrode as a mask, developing the photoresist layer so that the unexposed portion remains on the semiconductor layer in an area corresponding the gate electrode, etching the semiconductor layer using the remaining photoresist as a mask so as to form a semiconductor island on the insulating layer, and forming source and drain electrodes on opposite portions of the semiconductor island, said electrodes being separate from each other so that the semiconductor island functions as a channel region of the thin film field-effect transistor.

2. A method as claimed in claim 1 further including the steps of, after the formation of the semiconductor island, depositing a second insulating layer on the substrate to cover the semiconductor island and the first named insulating layer, depositing a second photoresist layer of the negative photoresist on the second insulating layer, exposing the second photoresist layer by irradiating from the bottom surface of the substrate so as to use the gate electrode as a mask, developing the second photoresist layer so that the second photoresist layer has an opening corresponding to the unexposed portion, etching the second insulating layer in the opening so that the semiconductor island is exposed, and removing the second photoresist layer so that there is exposed a substantially flat surface formed by the semiconductor island and the remaining second insulating layer surrounding the semiconductor island.

3. A method as claimed in claim 1 further including the steps of, after the formation of the semiconductor layer, forming on the semiconductor layer a second insulating layer at a thickness greatly larger than that of the semiconductor layer, depositing the above mentioned photoresist layer on the second insulating layer, exposing the photoresist layer by irradiating from the other surface of the substrate so as to use the gate electrode as the mask, developing the photoresist layer so that the unexposed portion remains on the second insulating layer to correspond to the gate electrode, etching the second insulating layer and the semiconductor layer using the remaining photoresist layer as the mask so as to form on the first named insulating layer the semiconductor island having the second insulating layer remaining on the top surface thereof, depositing on the substrate a third insulating layer at a thickness larger than the semiconductor layer but sufficiently smaller than the second insulating layer so that the semiconductor island, the remaining second insulator and the first named insulating layer are covered by the third insulating layer, the third insulating layer being formed of a material which can be etched at an etch rate sufficiently lower than that of the second insulating layer, and etching the second and third insulating layer with an etchant which etches the second insulating layer at a rate higher than that of the third insulating layer, whereby there is exposed a substantially flat surface formed by the semiconductor island and the remaining third insulating layer surrounding the semiconductor island.

4. A method as claimed in claim 1 wherein the formation of the semiconductor layer includes the step of forming an amorphous silicon layer on the insulating layer.

5. A method as claimed in claim 1 wherein the formation of the semiconductor layer includes the steps of forming an i-type amorphous silicon layer on the insulating layer and then forming an n+-type amorphous silicon layer on the i-type amorphous silicon layer.

6. A method of manufacturing a thin film field-effect transistor comprising the steps of forming a gate electrode on a top surface of a transparent substrate; forming an insulating layer to cover the gate electrode and the exposed top surface of the substrate; forming a semiconductor layer to cover the insulating layer by forming an i-type amorphous silicon layer on the insulating layer and then forming an n+-type amorphous silicon layer on the i-type amorphous silicon layer; providing an anti-oxidation protection coating of a conductive material on the n+-type amorphous silicon layer; depositing a positive photoresist layer on the anti-oxidation protection coating; exposing the photoresist layer by irradiating from the bottom surface of the substrate so as to use the gate electrode as a mask; developing the photoresist layer so that the unexposed portion remains on the anti-oxidation protection conductive coating to correspond to the gate electrode; etching the anti-oxidation protection conductive coating the semiconductor layer using the remaining photoresist as a mask so as to form a semiconductor island on the insulating layer; and forming source and drain electrodes on opposite portions of the conductive coating remaining on the semiconductor island separately from each other so that the semiconductor island will function as a channel region of the thin film field-effect transistor.

7. A method of manufacturing a thin film field-effect transistor comprising the steps of forming a gate electrode on a top surface of a transparent substrate, forming a first insulating layer to cover the gate electrode and the exposed top surface of the substrate, forming a semiconductor layer to cover the insulating layer, depositing a positive photoresist layer on the semiconductor layer, exposing the positive photoresist layer by irradiating from the bottom surface of the substrate so as to use the gate electrode as a mask, developing the positive photoresist layer so that the unexposed portion remains on the semiconductor layer to correspond to the gate electrode, etching the semiconductor layer using the remaining photoresist as a mask so as to form a semiconductor island on the insulating layer, depositing a second insulating layer on the substrate to cover the semiconductor island the first insulating layer, depositing a negative photoresist layer on the second insulating layer, exposing the negative photoresist layer by irradiating from the bottom surface of the substrate so as to use the gate electrode as a mask, developing the negative photoresist layer so that the negative photoresist layer has an opening corresponding to the unexposed portion, etching the second insulating layer in the opening so that the semiconductor island is exposed, removing the second photoresist layer so that there is exposed a substantially flat surface formed by the semiconductor island the remaining second insulating layer surrounding the semiconductor island, and forming source and drain electrodes on opposite portions of the semiconductor island, said source and drain being separate from each other so that the semiconductor island functions as a channel region of the thin film field-effect transistor.

8. A method of manufacturing an inverted stagger type of thin film transistor comprising the steps of forming a gate electrode on one surface of a transparent substrate, forming on the substrate a first insulating layer and a semiconductor layer in the named order to cover the gate electrode, forming on the semiconductor layer a second insulating layer at a thickness greatly larger than that of the semiconductor layer, depositing a positive photoresist layer on the second insulating layer, exposing the photoresist layer by irradiating from the other surface of the substrate so as to use the gate electrode as the mask, developing the photoresist layer so that the unexposed portion remains on the second insulating layer to correspond to the gate electrode, etching the second insulating layer and the semiconductor layer using the remaining photoresist layer as the mask so as to form on the first insulating layer the semiconductor island having the second insulating layer remaining on the top surface thereof, depositing on the substrate a third insulating layer at a thickness larger than the semiconductor layer but sufficiently smaller than the second insulating layer so that the semiconductor island, the remaining second insulator and the first insulating layer are covered by the third insulating layer, the third insulating layer being formed of a material which can be etched at an etch rate sufficiently lower than that of the second insulating layer, and etching the second and third insulating layer with an etchant which etches the second insulating layer at a rate higher than that of the third insulating layer, so that there is exposed a substantially flat surface formed by the semiconductor island and the remaining third insulating layer surrounding the semiconductor island, and forming source and drain electrodes on the semiconductor island.

* * * * *